United States Patent
Schmid

(10) Patent No.: US 9,159,959 B2
(45) Date of Patent: Oct. 13, 2015

(54) COMPONENT HAVING AN ORIENTED ORGANIC SEMICONDUCTOR

(75) Inventor: Günter Schmid, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/114,272

(22) PCT Filed: Mar. 28, 2012

(86) PCT No.: PCT/EP2012/055524
§ 371 (c)(1),
(2), (4) Date: Oct. 28, 2013

(87) PCT Pub. No.: WO2012/146456
PCT Pub. Date: Nov. 1, 2012

(65) Prior Publication Data
US 2014/0048794 A1 Feb. 20, 2014

(30) Foreign Application Priority Data

Apr. 27, 2011 (DE) .......... 10 2011 017 572

(51) Int. Cl.
H01L 51/56 (2006.01)
H01L 51/52 (2006.01)
H01L 51/50 (2006.01)
H01L 51/00 (2006.01)

(52) U.S. Cl.
CPC ........... *H01L 51/56* (2013.01); *H01L 51/0012* (2013.01); *H01L 51/0077* (2013.01); *H01L 51/5012* (2013.01); *H01L 51/52* (2013.01); *H01L 51/0032* (2013.01)

(58) Field of Classification Search
CPC ........................... H01L 51/56; H01L 51/0032
USPC ............................................... 257/40; 438/99
See application file for complete search history.

(56) References Cited

U.S. PATENT DOCUMENTS 4,618,509 A    10/1986  Bulkowski
4,842,845 A *   6/1989  Rocklage et al. ............ 424/1.77
(Continued)

FOREIGN PATENT DOCUMENTS

DE    10227850    1/2004
DE    10324388    12/2004
(Continued)

OTHER PUBLICATIONS

German Office Action for German Priority Patent Application No. 10 2011 017 572.5, issued Nov. 29, 2011.
(Continued)

*Primary Examiner* — Ida M Soward
(74) *Attorney, Agent, or Firm* — Staas & Halsey LLP

(57) ABSTRACT

For an organic semiconductor component and production thereof, an organic semiconductor layer is formed from complexes disposed on a boundary between a first layer and a second layer. The organic semiconductor layer is thereby orientated. The first layer is formed of a salt providing the central cations for the complexes. The second layer is formed of molecules that are the ligands of the complexes. Complex formation takes place when the second layer is deposited on the first layer.

21 Claims, 2 Drawing Sheets

(56) References Cited

U.S. PATENT DOCUMENTS

| | | | |
|---|---|---|---|
| 5,156,810 A * | 10/1992 | Ribi | 422/82.01 |
| 7,387,830 B2 * | 6/2008 | Maul et al. | 428/323 |
| 7,550,201 B2 * | 6/2009 | van Veggel et al. | 428/403 |
| 8,420,699 B1 * | 4/2013 | Dubow | 514/547 |
| 8,715,814 B2 * | 5/2014 | de Rochemont | 428/212 |
| 2002/0099157 A1 | 7/2002 | Stephan et al. | |
| 2004/0225122 A1 | 11/2004 | Thummel et al. | |
| 2005/0017759 A1 | 1/2005 | Weber et al. | |
| 2005/0048493 A1 * | 3/2005 | Kim | 435/6 |
| 2005/0099209 A1 | 5/2005 | Luyken et al. | |
| 2006/0151778 A1 | 7/2006 | Fontana et al. | |
| 2008/0035559 A1 * | 2/2008 | Kolesinski et al. | 210/502.1 |
| 2009/0326237 A1 | 12/2009 | Strassner et al. | |
| 2010/0044637 A1 | 2/2010 | Nazeeruddin et al. | |
| 2010/0141120 A1 | 6/2010 | Yersin et al. | |
| 2011/0031481 A1 * | 2/2011 | Von Wrochem et al. | 257/40 |
| 2011/0121273 A1 | 5/2011 | Jo et al. | |
| 2011/0175064 A1 | 7/2011 | Kim et al. | |
| 2011/0212258 A1 | 9/2011 | Yersin et al. | |
| 2012/0169213 A1 | 7/2012 | De Cola et al. | |
| 2012/0181485 A1 * | 7/2012 | Hsu | 252/500 |

FOREIGN PATENT DOCUMENTS

| | | |
|---|---|---|
| DE | 10345160 | 5/2005 |
| DE | 102006030860 | 1/2008 |
| DE | 102009031683 | 3/2011 |
| DE | 102011017572.5 | 4/2011 |
| EP | 1212271 | 1/2004 |
| EP | 2287936 | 2/2011 |
| GB | 1572182 | 7/1980 |
| JP | 52-35579 | 3/1977 |
| JP | 62-224964 | 10/1987 |
| JP | 2009-212164 | 9/2009 |
| JP | 4618509 | 1/2011 |
| WO | 2004/063308 | 7/2004 |
| WO | 2007/004113 | 1/2007 |
| WO | 2008/000726 | 1/2008 |
| WO | 2010/048936 | 5/2010 |
| WO | PCT/EP2012/055524 | 3/2012 |

OTHER PUBLICATIONS

English language International Search Report for PCT/EP2012/055524, mailed Jul. 4, 2012.

Office Action mailed Dec. 2, 2014 for corresponding Japanese Patent Application No. 2014-506809.

Japanese Notice of Allowance for related Japanese Patent Application No. 2014-506809, issued on Jul. 31, 2015, 4 pages.

* cited by examiner

COMPONENT HAVING AN ORIENTED ORGANIC SEMICONDUCTOR

CROSS REFERENCE TO RELATED APPLICATIONS

This application is based on and hereby claims priority to International Application No. PCT/EP2012/055524 filed on Mar. 28, 2012 and German Application No. 10 2011 017 572.5 filed on Apr. 27, 2011, the contents of which are hereby incorporated by reference.

BACKGROUND

The present invention relates to organic semiconductor components, and to their production.

Semiconductor layers employed in the organic semiconductor components sector are primarily amorphous. The lack of order in these amorphous layers is a disadvantage for a variety of physical properties, for example for the important conductivity of the semiconductor layers. A very specific disadvantage for the efficiency of the components arises, however, in the area of the light-emitting components, more particularly of organic light-emitting diodes. In these components, the unoriented emission harbors a large loss factor for the external quantum efficiency, i.e., the fraction of photons generated that is also actually emitted to the outside. Existing organic light-emitting diodes feature an external quantum efficiency, without outcoupling aids, of not more than about 20%.

The efficiency of organic light-emitting diodes is measured using the light yield. Besides the internal quantum efficiency, which is determined by parameters inherent in the material of the emitters and by the self-absorption properties of the semiconductor layers, optical parameters make a large contribution to a reduction in the external quantum efficiency—that is, the photons actually emitted to the outside. These parameters are, for example, incoupling losses into the glass substrate, the excitation of waveguide modes, and the losses due to excitation of plasmons in the reflecting electrodes. In order to date to minimize the losses due to undirected emission within the OLED, the reflective electrodes have been fabricated from reflective material such as aluminum or silver, for example, leading to high reflection of the photons generated. This solution, however, is not very effective, since the excitation of plasmons in the electrodes means that there are again large losses of the generated light quanta here also. These losses due to plasmons amount to approximately 30%. These losses can only be reduced if a lower proportion of the photons generated actually impinges on the reflective electrodes to start with. In other words, the emission would have to be directed in such a way that the number of emitting dipole vectors normal to the reflective electrodes becomes minimal.

A fundamental barrier to the orientation of the emitters, however, is that first of all it is necessary to know the direction in which a molecule is emitting, in relation to its internal molecular coordinate system. Depending on the spatial orientation of HOMO (highest occupied molecular orbital) and LUMO (lowest unoccupied molecular orbital), the first excited state has a different dipole moment from the ground state. The emission dipole correlates with the dipole moment in the ground state.

SUMMARY

It is one possible object, therefore, to specify a method by which orientation of organic semiconductors can be achieved on the materials side. A further potential object is to specify an organic semiconductor component having a semiconductor layer which features an orientation.

The inventor proposed a production method for an organic semiconductor component, an organic semiconductor layer comprising an orientation is deposited. The orientation is ensured by the deposition of a second layer comprising ligands onto a first layer comprising a salt of a central cation. The effect of the salt-containing layer is to vary the surface potential of the underlying substrate. If the layer containing ligands is deposited onto the salt-containing layer, there is complex formation between the ligands and the cations of the salt directly on the surface of the salt-containing layer. As a result, at this boundary layer, complexes are produced from the ligands with a predetermined orientation of their dipoles. As a result of the coordination, therefore, the ligand molecules are oriented on the basis of the potential profile on the surface. The production method has the advantage that this orientation of the molecules takes place independently of an electrical field. Through the orientation of the dipole moments it is possible to adapt and influence physical properties of the semiconductor layer, such as, for example, its electrical conductivity and also its optical properties. Especially when the oriented molecules are emitter molecules, it is therefore possible in organic light-emitting diodes to reduce the plasmon losses at the reflective electrode and hence to raise their efficiency by up to 30%.

For the case of green emitters in particular, a single double layer of first and second layer is sufficient. In one advantageous embodiment, however, in the production method, in repeat alternation, a second layer comprising ligands is deposited in each case onto a first layer comprising a salt. As a result of this multi-ply deposition, any desired layer thickness of an active organic semiconductor layer can be achieved. Nevertheless, each of the thin layers deposited individually is oriented by the complexing at the surface. More particularly at least 2, but not more than 10, of the double layers comprising first and second layer are deposited. As a result of the alternating deposition of thin layers of organic molecules and the salt, a potential pattern is generated again and again that controls the relative arrangement of the molecules to one another. This deposition may take place either from the liquid phase or from the gas phase. For deposition from the liquid phase, known methods can be employed.

In the case of deposition from the gas phase, layers with ligands and layers with a salt are evaporated on in alternation. For the salt-containing layer here, in particular the salt only is deposited in very thin layers of less than 2 nm, more particularly less than 1 nm. The salt layer serves to bring about a variation in the surface potential on the substrate.

In a further advantageous embodiment, in the production method, the organic semiconductor layer is deposited onto a first electrode on a substrate, or onto a further organic semiconductor layer. In other words, the deposition of oriented organic semiconductors is suitable for different functionalities of the semiconductor layers. Thus, for example, a hole conduction layer and/or an emitter layer and/or an electron transport layer are deposited with orientation.

Known methods for the deposition from the liquid phase are, for example, printing (ink-jet printing, gravure printing, knifecoating, etc.) or rotary coating, it being possible for the solvent to comprise, by way of example but not of restriction, the following liquid vaporizable organic substances: PGMEA (propylene glycol monoethyl ether acetate), tetrahydrofuran, dioxane, chlorobenzene, diethylene glycol diethyl ether, diethylene glycol monoethyl ether, gamma-butyrolactone, N-methylpyrrolidinone, ethoxyethanol, xylene, toluene, anisole, phenetole, acetonitrile, etc. Other organic and inorganic and also polar and nonpolar solvents, and solvent mixtures, can also be employed.

By way of example, polymeric compounds may function additionally as matrix material. By way of example but not of restriction, these may be polyethylene oxides (polyethylene glycols), polyethylenediamines, polyacrylates such as polymethyl methacrylate (PMMA) or polyacrylic acid and/or salts thereof (superabsorbents), but also substituted or unsubstituted polystyrenes such as poly-p-hydroxystyrene, polyvinyl alcohols, polyesters, or polyurethanes. Moreover, by way of example, polyvinylcarbazoles, polytriarylamines, polythiophenes and/or polyvinylidenephenylenes may also contribute to improving the semiconducting properties.

For the deposition, the salts are, in particular, vaporized or deposited from polar solvents such as preferably from water, alcohols and cyclic or acyclic ethers. For further stabilization, a salt is deposited, in particular by co-vaporization with a matrix. In that case the salt fraction in the matrix is between 10% and 100%, for example.

In a further advantageous embodiment, in the production method, one first layer or the two or more first layers are deposited up to a maximum layer thickness of 2 nm, thereby establishing a modified surface potential of the underlying electrode surface or the surface of the further organic semiconductor layer. The salt in the first layer or in the plurality of first layers therefore brings about an alteration of this kind in the surface such that molecules deposited thereon undergo corresponding orientation. For this change in surface potential, a salt-containing layer thickness of not more than 2 nm is sufficient. In particular, layers that are even thinner still, below 1 nm, are also sufficient for modifying the surface potential accordingly. In particular, therefore, even from the salt molecules, only a few monolayers are deposited, which are then able to coordinate with the organic layer deposited thereon and with the molecules present therein. In one particularly advantageous embodiment, the first layer or the two or more first layers, in their low layer thickness, contain(s) precisely the number of salt molecules that may coordinate with the adjacent organic molecular layer. As a result of the coordination which occurs as soon as the organic molecules of a second layer impinge on the salt molecules of the first layer, the associated directed arrangement of the resultant complexes is brought about.

In another advantageous embodiment, in the production method, the one second layer or the two or more second layers is or are each deposited up to a maximum layer thickness of 100 nm, more particularly of 20 nm.

Emitter layers are deposited for example with preference in layers of 5 nm to 20 nm. In certain cases emitter layers may also have layer thicknesses of up to 100 nm.

The maximum layer thickness of the second layer has the advantage that the quantity of molecules deposited is only that which can also experience orientation as a result of the underlying salt layer and the change in potential which this brings about. Above a certain layer thickness, the molecules deposited further on the top no longer see any influence of the underlying salt layer. For extremely comprehensive orientation of the overall organic semiconductor layer, therefore, it is necessary to limit the layer thickness of the second layer or of the two or more second layers.

In another advantageous embodiment, in the production method, the ligands are deposited together with a further organic semiconductor material. The ligands, for example, comprise an emitter material, and the further organic semiconductor material comprises, for example, a matrix material into which the emitter is embedded.

Alternatively, the ligands comprise the matrix material, and the further organic material comprises, for example, a dopant, which is in turn embedded into the matrix. Ligand and organic semiconductor material are selected more particularly such that the further organic semiconductor material also undergoes an organization as a result of the coordination and orientation of the ligands. Especially when the ligands comprise a matrix material, the further organic semiconductor material embedded therein, whether it be an emitter or a dopant, is also deposited with a certain degree of orientation. The matrix is preferably oriented around an emitter, to allow said emitter to accommodate itself in this potential field. Emitters in particular are often deposited in dilution in a matrix. If the matrix is oriented, therefore, the emitter is oriented at the same time.

The organic semiconductor component comprises at least one organic semiconductor layer comprising complexes. These complexes have a central cation and at least one ligand coordinated thereto, and the complexes are arranged at a boundary between a first layer and a second layer. The first layer here comprises a salt of the central cation, and the second layer comprises the ligands. As a result, the organic semiconductor layer has an orientation.

An advantage of this is that various physical properties of this oriented organic semiconductor layer are improved, relative to those of an unordered organic semiconductor layer. These properties are, for example, their emission properties, when the oriented semiconductors are emitters. The property in question may also be improved conductivity, when the oriented semiconductors comprise a transport material, such as an electron or hole transport material. Alternatively, the property in question may be improved absorption of irradiated electromagnetic radiation in the organic semiconductor material, if the material in question, for example, is an absorber material.

Absorber materials of these kinds are used for example in organic solar cells, more particularly for thin-film components.

In one advantageous embodiment the organic semiconductor component has an organic semiconductor layer which comprises a plurality of boundaries each between a first layer and a second layer, with complexes being arranged at each of these boundaries. In this case the respective first layer comprises a salt of the central cation, and the respective second layer comprises the ligands. This multilayer construction has the advantage that the numerous boundaries ensure consistent orientation of the thin layers of organic material.

In another advantageous embodiment the organic semiconductor component comprises at least one substrate, one first electrode, and one second electrode. This construction is suitable with preference for light-emitting components or else for photodetectors and solar cells. The organic semiconductor component may also, for example, comprise a third electrode and have a construction or an arrangement with three electrodes, of the kind known for organic field-effect transistors.

The afore-described orientation of the complexes at the boundary between first and second layers, resulting from the coordination of the ligand molecules to the salt cations, can be used in the area of organic field-effect transistors preferably for improving charge injection at the electrodes. Where the improvement occurs only on a field-dependent basis, the method is also suitable for improving charge transport in the channel.

In a further advantageous embodiment the organic semiconductor component has a first layer or a plurality of first layers each having a layer thickness of not more than 2 nm.

More particularly the first layers have a layer thickness of only 1 nm at most. The low layer thickness on the one hand is sufficient for the desired orientation of the ligand molecules deposited thereon, and on the other hand the low layer thickness also ensures that no excessively thick salt layer could have adverse consequences for the properties of the component. A salt-containing layer that was excessively thick would not ensure that substantially all of the salt molecules do not coordinate to form a complex with one or more ligands or that the transport properties of the layer as a whole are not adversely affected.

In a further advantageous embodiment, the organic semiconductor component has a second layer or a plurality of second layers each with a maximum layer thickness of 100 nm, more particularly of 20 nm. As already described above, the advantage of the maximum layer thickness is that all of the ligands present in this layer thickness experience orientation as a result of the underlying salt layer. Above a limiting layer thickness, the underlying salt layer would no longer have any influence over the ligand molecules.

In a further advantageous embodiment the organic semiconductor component comprises ligands selected from the class of materials comprising neutral small molecules. The neutral small molecules are better known simply as small molecules. In the majority of cases, owing to the molecular design, this materials class of the organic semiconductors is insoluble or only very sparingly soluble. The preferred mode of deposition is therefore gas-phase deposition or the thermal evaporation of these small molecules. Moreover, the small molecules are substantially neutral in relation to their electrical charge. Furthermore, in comparison to salts, they have significantly lower dipole moments. Where the ligands, during deposition, impinge on the salt-containing first layer, they are able to coordinate with the cations of the salt and form a complex. This complex then has a dipole moment (cation-anion) which also ensures the orientation. Furthermore, the process can also be classed as one in which the substantially neutral small molecules are rendered ionic as a result of this complexation. An advantage of this is that in the case of transport materials, for example, the energy gap in these transport materials between HOMO and LUMO can be substantially retained, but their fluorescence properties intensify and mean that the semiconductors, otherwise used only for charge transport, become efficient emitters. Complexation of these molecules, however, may also have beneficial influence on other properties.

By co-condensation it is also possible for entirely new complexes to be formed.

In a further advantageous embodiment the ligands are selected from the class of materials of the emitters, hole transporters or electron transporters, or matrix materials. The orientation of ligands is therefore not confined to emitters or transport materials.

Fluorescent and phosphorescent emitters generally possess one or more heteroatoms which are potentially suitable as a ligand for coordination to a central cation. Examples of coordinatable emitter molecules are as follows:
3-(2-benzothiazolyl)-7-(diethylamino)coumarin
2,3,6,7-tetrahydro-1,1,7,7-tetramethyl-1H,5H,11H-10-(2-benzothiazolyl)
N,N'-dimethylquinacridone
9,10-bis[N,N-di(p-tolyl)amino]anthracene
9,10-bis[phenyl(m-tolyl)amino]anthracene
bis[2-(2-hydroxyphenyl)benzothiazolato]zinc(II)
$N^{10},N^{10},N^{10'},N^{10'}$-tetratolyl-9,9'-bianthracene-10,10'-diamine
$N^{10},N^{10},N^{10'},N^{10'}$-tetraphenyl-9,9'-bianthracene-10,10'-diamine
$N^{10},N^{10'}$-diphenyl-$N^{10},N^{10'}$-dinaphthalenyl-9,9'-bianthracene-10,10'-diamine
4,4'-bis(9-ethyl-3-carbazovinylene)-1,1'-biphenyl
1,4-bis[2-(3-N-ethylcarbazoryl)vinyl]benzene
4,4'-bis[4-(di-p-tolylamino)styryl]biphenyl
4-(di-p-tolylamino)-4'-[(di-p-tolylamino)styryl]stilbene
4,4'-bis[4-(diphenylamino)styryl]biphenyl
bis(2,4-difluorophenylpyridinato)tetrakis(1-pyrazolyl)borate iridium III
N,N'-bis(naphthalene-2-yl)-N,N'-bis(phenyl)tris-(9,9-dimethylfluorenylene)
2,7-bis{2-[phenyl(m-tolyl)amino]-9,9-dimethylfluoren-7-yl}-9,9-dimethylfluorene
N-(4-((E)-2-(6-((E)-4-(diphenylamino)styryl)naphthalen-2-yl)vinyl)phenyl)-N-phenylbenzenamine
1,4-di[4-(N,N-diphenyl)amino]styrylbenzene
1,4-bis(4-(9H-carbazol-9-yl)styryl)benzene
(E)-6-(4-(diphenylamino)styryl)-N,N-diphenylnaphthalen-2-amine
(E)-2-(2-(4-(dimethylamino)styryl)-6-methyl-4H-pyran-4-ylidene)malononitrile
(E)-2-(2-tert-butyl-6-(2-(2,6,6-trimethyl-2,4,5,6-tetrahydro-1H-pyrrolo[3,2,1-ij]quinolin-8-yl)vinyl)-4H-pyran-4-ylidene)malononitrile
2,6-bis(4-(di-p-tolylamino)styryl)naphthalene-1,5-dicarbonitrile
4-(dicyanomethylene)-2-tert-butyl-6-(1,1,7,7-tetramethyljulolidin-4-ylvinyl)-4H-pyran
4-(dicyanomethylene)-2-methyl-6-(1,1,7,7-tetramethyljulolidyl-9-enyl)-4H-pyran
4-(dicyanomethylene)-2-methyl-6-julolidyl-9-enyl-4H-pyran.

Transporters used for transporting charge carriers in an OLED are neutral hole and electron transporters. Hole transporters are based largely on triarylamines or else on carbazoles, whereas heterocyclic, nitrogen-containing aromatics are mostly used as electron transporters.

Fundamental structural units of hole transporters and electron transporters are shown by way of example:

| Typical units in representatives for hole transporters: | | Typical units in representatives for electron transporters: |
| --- | --- | --- |
| Triarylamine | Carbazole | X = C—H or N |

Typical hole transport materials capable of coordination to a positively charge center are the following, by way of example but without restriction:
N,N'-bis(naphthalen-1-yl)-N,N'-bis(phenyl)-9,9-dimethylfluorene
N,N'-bis(3-methylphenyl-N,N'-bis(phenyl)-9,9-diphenylfluorene N,N'-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2',7,7'-tetrakis(N,N-diphenylamino)-9,9'-spirobifluorene
N,N'-bis(naphthalen-1-yl)-N,N'-bis(phenyl)benzidine
N,N'-bis(naphthalen-2-yl)-N,N'-bis(phenyl)benzidine
N,N'-bis(3-methylphenyl)-N,N'-bis(phenyl)benzidine
N,N'-bis(3-methylphenyl)-N,N'-bis(phenyl)-9,9-dimethylfluorene
N,N'-bis(naphthalen-1-yl)-N,N'-bis(phenyl)-9,9-spirobifluorene
di-[4-(N,N-ditolylamino)phenyl]cyclohexane
2,2',7,7'-tetra(N,N-ditolyl)aminospirobifluorene
9,9-bis[4-(N,N-bisbiphenyl-4-ylamino)phenyl]-9H-fluorene
2,2',7,7'-tetrakis[N-naphthalenyl(phenyl)amino]-9,9-spirobifluorene
2,7-bis[N,N-bis(9,9-spirobifluorene-2-yl)amino]-9,9-spirobifluorene
2,2'-bis[N,N-bis(biphenyl-4-yl)amino]-9,9-spirobifluorene
N,N'-bis(phenanthren-9-yl)-N,N'-bis(phenyl)benzidine
N,N,N',N'-tetranaphthalen-2-yl-benzidine
2,2'-bis(N,N-diphenylamino)-9,9-spirobifluorene
9,9-bis[4-(N,N-bisnaphthalen-2-ylamino)phenyl]-9H-fluorene
9,9-bis[4-(N,N'-bisnaphthalen-2-yl-N,N'-bisphenylamino)phenyl]-9H-fluorene
titanium oxide phthalocyanine
copper phthalocyanine
2,3,5,6-tetrafluoro-7,7,8,8-tetracyanoquinodimethane
4,4',4''-tris(N-3-methyphenyl-N-phenylamino)triphenylamine
4,4',4''-tris(N-(2-naphthyl)-N-phenylamino)triphenylamine
4,4',4''-tris(N-(1-naphthyl)-N-phenylamino)triphenylamine
4,4',4''-tris(N,N-diphenylamino)triphenylamine
pyrazino[2,3-f][1,10]phenanthroline-2,3-dicarbonitrile
N,N,N',N'-tetrakis(4-methoxyphenyl)benzidine.

Typical electron transport materials capable of coordination to a positively charged center are as follows, by way of example but without restriction:
2,2',2''-(1,3,5-benzenetriyl)-tris(1-phenyl-1H-benzimidazole)
2-(4-biphenylyl)-5-(4-tert-butylphenyl)-1,3,4-oxadiazole
2,9-dimethyl-4,7-dipyhenyl-1,10-phenanthrolin
8-hydroxyquinolinolatolithium
4-(naphthalen-1-yl)-3,5-diphenyl-4H-1,2,4-triazole
1,3-bis[2-(2,2'-bipyridin-6-yl)-1,3,4-oxadiazo-5-yl]benzene
4,7-diphenyl-1,10-phenanthroline
3-(4-biphenylyl)-4-phenyl-5-tert-butylphenyl-1,2,4-triazole
bis(2-methyl-8-quinolinolate)-4-(phenylphenolato)aluminum
6,6'-bis[5-(biphenyl-4-yl)-1,3,4-oxadiazo-2-yl]-2,2'-bipyridyl
2-phenyl-9,10-di(naphthalene-2-yl)anthracene
2,7-bis[2-(2,2'-bipyridine-6-yl)-1,3,4-oxadiazo-5-yl]-9,9-dimethylfluorene
1,3-bis[2-(4-tert-butylphenyl)-1,3,4-oxadiazo-5-yl]benzene
2-(naphthalen-2-yl)-4,7-diphenyl-1,10-phenanthroline
2,9-bis(naphthalen-2-yl)-4,7-diphenyl-1,10-phenanthroline
tris(2,4,6-trimethyl-3-(pyridin-3-yl)phenyl)borane
1-methyl-2-(4-(naphthalen-2-yl)phenyl)-1H-imidazo[4,5-f][1,10]phenanthroline
4,7-di(9H-carbazol-9-yl)-1,10-phenanthroline
4-(naphthalen-1-yl)-3,5-diphenyl-4H-1,2,4-triazole
4,4'-bis(4,6-diphenyl-1,3,5-triazin-2-yl)biphenyl
1,3-bis[3,5-di(pyridin-3-yl)phenyl]benzene
1,3,5-tri[(3-pyridyl)-phen-3-yl]benzene
3,3',5,5'-tetra[(m-pyridyl)-phen-3-yl]biphenyl.

A weak fluorescence is inherent in all hole and electron conductors. It has been found that the transition moment is altered by the coordination and as a result the fluorescence intensity is greatly increased. The effect on the HOMO-LUMO distance, however, is only weak, and so in the common transport materials a blue to deep-blue absorption can be observed.

Shown below are further exemplary heterocycle units which are capable of coordination and are therefore suitable for producing compounds for use in the method described:

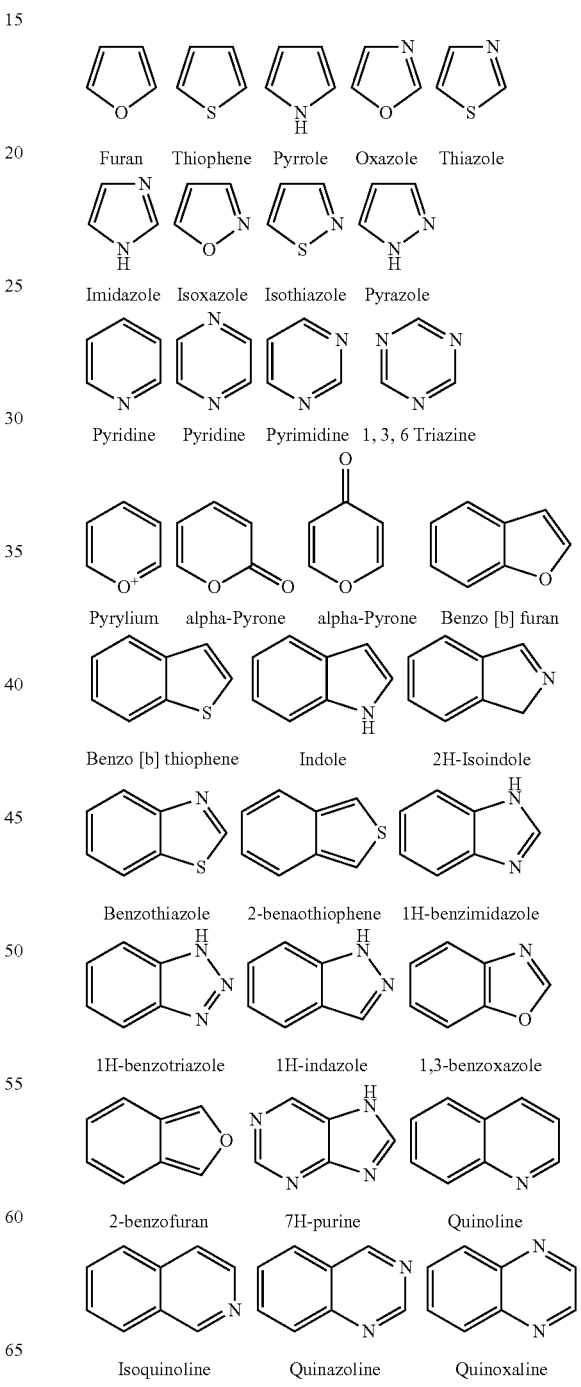

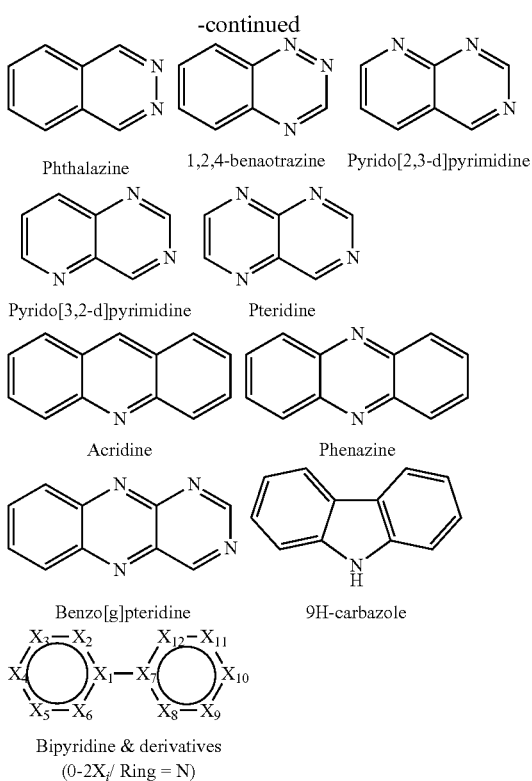

Phthalazine  1,2,4-benaotrazine  Pyrido[2,3-d]pyrimidine

Pyrido[3,2-d]pyrimidine  Pteridine

Acridine  Phenazine

Benzo[g]pteridine  9H-carbazole

Bipyridine & derivatives
(0-2X/ Ring = N)

The central cations are, in particular, metal cations, alkali metal or alkaline earth metal cations, or ammonium ions. For example, the central cations are also selected from the quantity of the substituted derivatives of the ions listed. These cations are particularly suitable for coordinating ligands such as small molecules and having positive effects on the emitter properties and/or transport properties thereof.

The heteroatoms shown above can be utilized for coordination to central cations, preferably metal ions. The resulting complexes formed are usually very stable, and may also be isolated in pure form. In principle it is possible to use all metal ions of the Periodic Table of the Elements, but particular preference is given to the main group elements of the alkali metal and alkaline earth metal groups, more particularly to the very small lithium. Also advantageous, however, are ions such as ammonium or its substituted derivatives. Suitable coordination sites are the heteroatoms O, S, Se, N, or P. Coordination of two or more neutral molecules to a metal center takes place in particular.

The salts used have, in particular, simple anions, which are selected preferably, but without restriction, from the following examples:
fluoride,
sulfate,
phosphate,
carbonate,
trifluoromethanesulfonate,
trifluoroacetate,
tosylate,
bis(trifluoromethylsulfon)imide,
tetraphenylborate,
$B_9C_2H_{11}^{2-}$,
hexafluorophosphate,
tetrafluoroborate,
hexafluoroantimonate,
tetrapyrazolatoborate.

Particularly preferred are:
$BF_4^-$,
$PF_6^-$,
$CF_3SO_3^-$,
$ClO_4^-$,
$SbF_6^-$.
Also suitable are complex anions such as, for example:
$Fe(CN)_6^{3-}$,
$Fe(CN)_6^{4-}$,
$Cr(C_2O_4)_3^{3-}$,
$Cu(CN)_4^{3-}$,
$Ni(CN)_4^{2-}$.
Experimentally it has been found that the halogens chloride, bromide, and iodide act as quenchers.

The organic semiconductor component features in particular at least one substrate, one first electrode, and one second electrode, the organic semiconductor component being a light-emitting component, more particularly an OLED or an OLEEC. In the light-emitting components the coordination of the small molecules and the associated orientation is particularly advantageous when the ligands are emitter molecules or when emitter molecules are oriented by the orientation of the matrix surrounding them. Through the orientation of the dipole moment of the molecule in the ground state it is possible to influence the direction of emission and hence to make the components more efficient, since it is no longer necessary to accept any losses due to emission of fluorescence radiation in the direction of the reflecting cathode.

An alternative organic semiconductor component is the organic field effect transistor. This transistor, as well as the first and second electrodes, also has a third electrode, with the three electrodes being arranged as gate electrode, source electrode, and drain electrode. In a component of this kind, the oriented semiconductor layer is used in the channel of the field effect transistor, for charge injection at the electrodes. In the case of field dependency, the method is also suitable for improving the charge transport in the channel. By the production method described, the transport materials can be oriented in such a way that conductivity is increased.

A further alternative component is an organic photodetector or an organic solar cell. In the area of thin-film solar cells in particular, the orientation of the semiconductor material may have beneficial consequences for its absorber properties.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
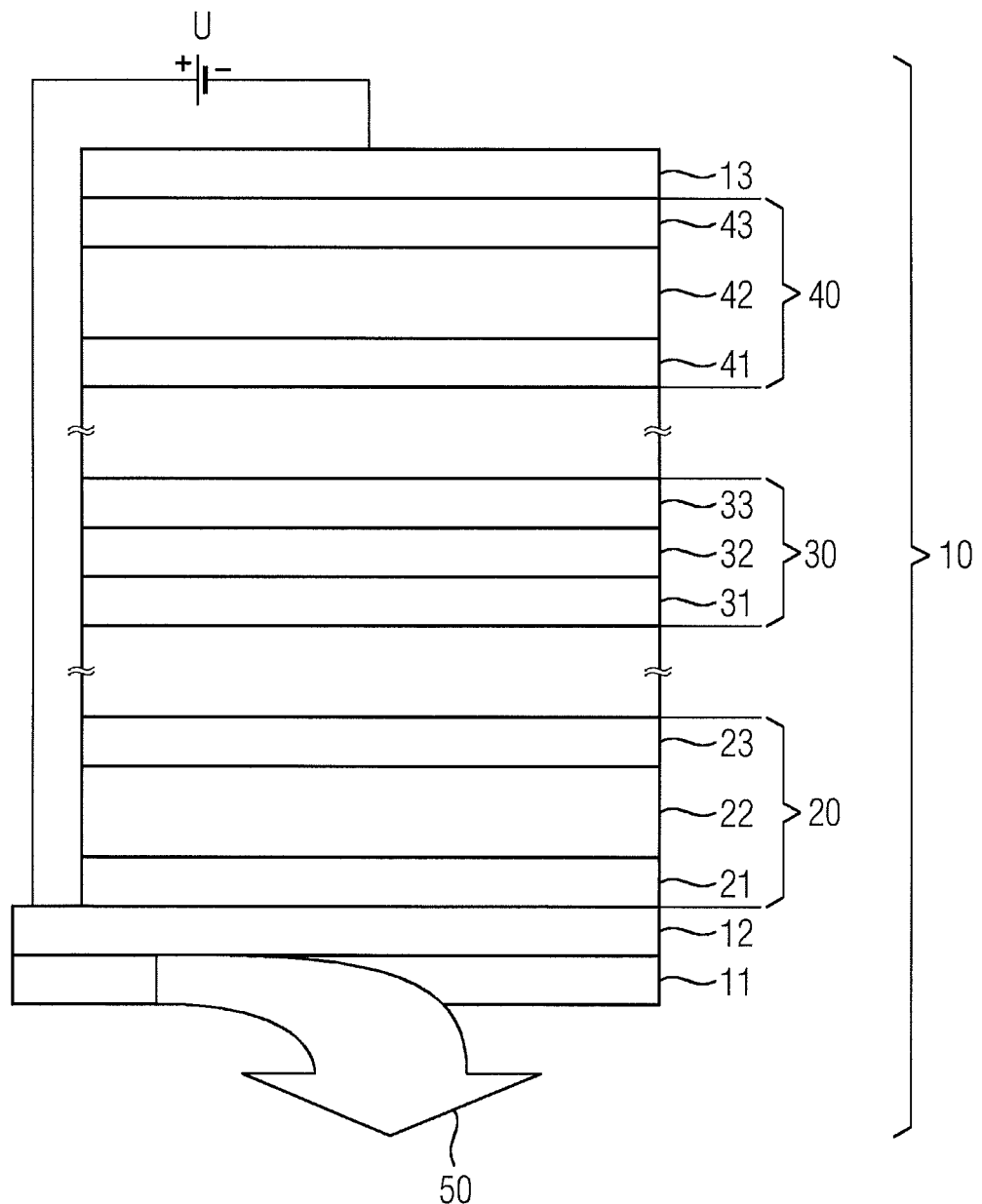
FIG. 1 shows a schematic construction of a component.

Reference will now be made in detail to the preferred embodiments of the present invention, examples of which are illustrated in the accompanying drawings, wherein like reference numerals refer to like elements throughout.

Shown in FIG. 1, first of all, are a plurality of layers arranged one above another. The bottommost layer 11 represents the substrate, on which the component 10 is constructed. This substrate 11 is in particular a transparent substrate, made of glass, for example, through which the light 50 generated in the component 10 can emerge. Where the component in question is not a light-emitting component, but instead, for instance, a photodetector or a solar cell based on organic semiconductors, a transparent substrate 11 through which the electromagnetic radiation to be detected can enter into the component and into the active layers 20, 30, 40 is also expedient. Located on the substrate is an electrode layer 12. This is more particularly an indium tin oxide (ITO) electrode. This material is transmissive in the visible light wavelength range. Alternatives for transparent electrodes are what are called TCOs, transparent conductive oxides. The electrode 12 is applied more particularly with patterning on the substrate 11. The electrode 12 functions more particularly as an anode in the component.

The uppermost layer shown in FIG. 1 is again an electrode layer 13. This electrode layer, for example, is a metal electrode, made of aluminum or silver, for example. In light-emitting components 10, in particular, it is the reflection property of this metallic electrode 13, which acts in particular as a cathode in the component, that is significant. The metallic electrode 13 is applied in particular by thermal evaporation to the active organic semiconductor layers 20, 30, 40.

Furthermore, FIG. 1 shows leads going to the electrodes 12, 13, which are connected to a voltage supply. The component voltage U is applied by way of this voltage supply.

Shown between the electrodes 12, 13 are a multiplicity of organic semiconductor layers with different functions. The anode 2 is followed by the hole conducting region 20, comprising in particular a hole injection layer 21, a hole transport layer 22, and an electron blocking layer 23. Following from the cathode side 13 is the electron transport region 40. This region, analogously, has an electron injection layer 43, an electron transport layer 42, and a hole blocking layer 41. Located between the hole transport region 20 and the electron transport region 40 is the emission region 30. This region has, in particular, different emitter layers with different colors. Shown in FIG. 1 are three layers: a red emission layer 31, a green emission layer 32, and a blue emission layer 33.

The construction shown is typical of an organic light-emitting diode 10. This diode is constructed in particular on the basis of what are called small molecules. These molecules are deposited in thin layers, preferably by thermal evaporation, and can be used to construct multilayer systems of the kind of which one is shown in FIG. 1. In particular it is also possible for additional functional layers to be incorporated as well.

Whereas in the related art the emitter layers are formed as amorphous semiconductor layers, it is possible, with the proposed orientation of organic semiconductors, to orient these layers in such a way that the emission also takes place directedly. Since the undirected emitters emit in all spatial directions to equal extents, the transparent reflective electrode, in this case the cathode 13, is particularly important in the related art in order to reflect the photons, so that they are able to leave the component 10 through the transparent anode 12 and the transparent substrate 11. This reflection, however, as a result of plasmons, is accompanied by high losses. The oriented emitter layers 30, in contrast, are distinguished by directed emission, which is minimal at least in the direction of the reflective electrode 13.

Figure 2:
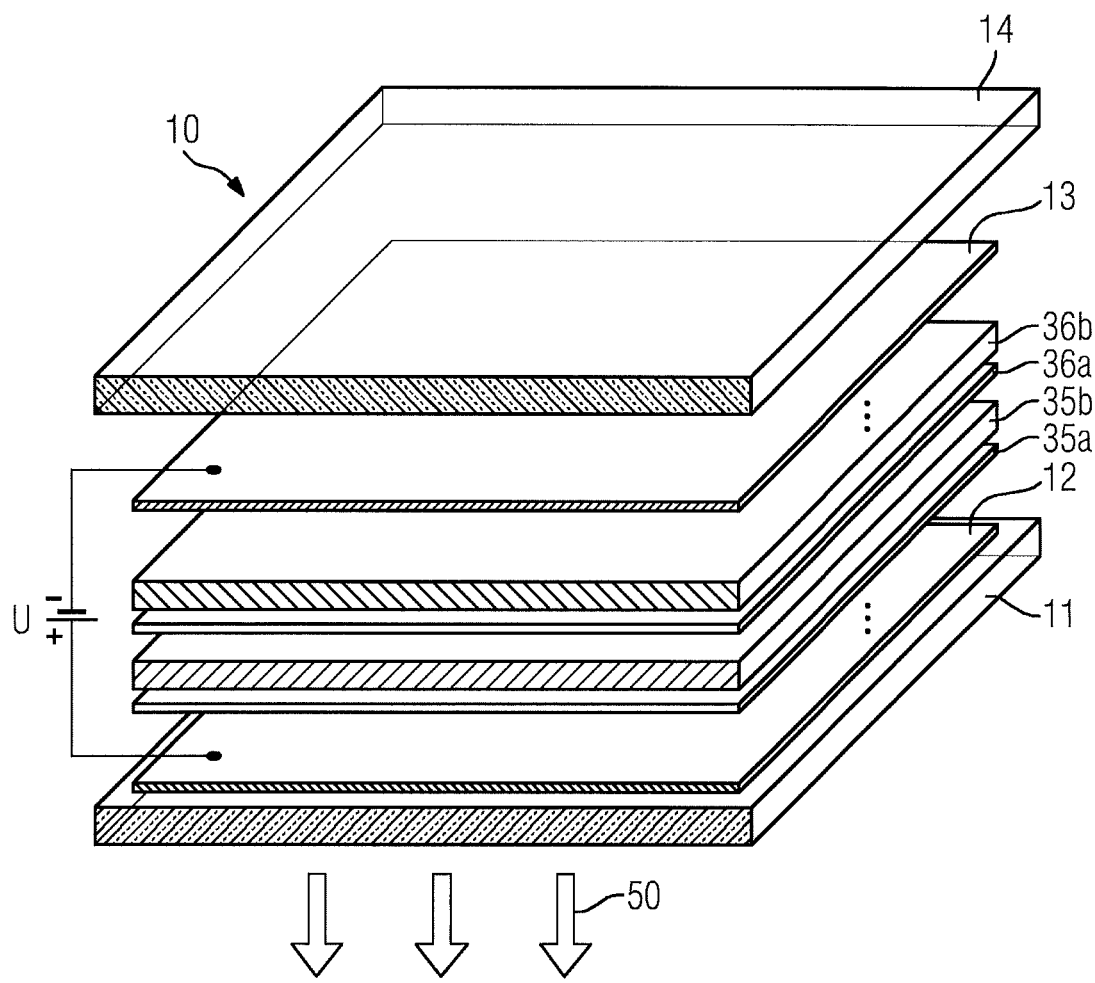
FIG. 2 shows a perspective view of the stacked layers.

FIG. 2 shows a schematic perspective view of exploded layers. Again, these layers may represent a light-emitting component 10 such as an OLED or an OLEC, for example. However, this construction can also be used for organic photodetectors or organic solar cells. In this case, again, the bottommost layer 11 is the substrate, more particularly the transparent substrate. It is again made, for example, of glass. Deposited thereon is a thin electrode layer 12, which is connected in particular as an anode of the component and which in particular is also transparent, i.e., is preferably made of a transparent conductive oxide. The second electrode 13 is connected in particular as a cathode in the component and is located opposite the anode 12 on the other side of the organic active semiconductor layer.

Shown further in the view of FIG. 2 is an encapsulation 14 which protrudes in particular over all of the other active layers and is able to enclose them together with the substrate 11. In the area of organic semiconductor materials, an encapsulation 14 is important in order to prevent degradation mechanisms through water or oxygen.

Figure 3:
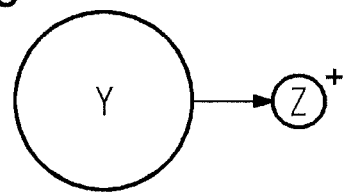
FIG. 3 shows a schematic representation of the coordination.

Applied to the electrodes 12, 13 again are voltage leads from a voltage supply for the component. Shown between the electrodes 12, 13 are, in particular, two double layers 35, 36 each being formed of a salt layer 35a, 36a and a ligand layer 35b, 36b. This ligand may form 100% of the organic semiconductor layer, or else may be present together with another organic semiconductor material in the layer 35b, 36b. This is the case, for example, if the ligand is a matrix material that incorporates, for example, a dopant or an emitter. Alternatively, however, the ligand may also be an emitter which is embedded in turn in a matrix. In the production of the component, first of all a salt layer 35a, 36a would be deposited, with a maximum layer thickness in particular of 2 nm. The ligand layer 35b, 36b would be deposited on this salt layer 35a, 36a. When the ligands Y and the salts meet one another, the ligands coordinate to the cations of the salt layer 35a, 36a, and so complexes are formed from these ligands Y and cations. The coordination of a molecule Y to a central cation Z is also shown, in greatly simplified form and schematically, in FIG. 3. The application of the ligands Y to the salt layer dictates the orientation of these complexes in z-direction, i.e., perpendicular to the salt layer. It is possible for alternating dipole structures or comblike structures to be formed. A complex of this kind has a dipole moment which affects the electrical and optical properties of the molecule. In the case of an emitter molecule Y, the dipole orientation of the complex dictates the direction of emission when the molecule Y is excited. Consequently, the layerwise construction leads to multiple layers of oriented emitter complexes which emit in a direction which can be predetermined.

The orientation of organic semiconductor materials by this production method, the successive deposition of pairs of salt layers and ligand layers, may also be of advantage in the area of thin-film solar cells with little absorber material, in order to maximize the absorption of the electromagnetic radiation which arrives only on one side. Furthermore, an orientation of this kind can also be used for improving the conductivity of organic semiconductor materials. One specific example of this is the use of oriented layers for charge injection at the electrodes in a field effect transistor. If the organic semiconductor material in this region of the component, between drain electrode and source electrode, is provided with a defined orientation, this can lead to an increase in the mobility. If the mobility is field-dependent, this leads, for example, to improved switching behavior.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A production method for an organic semiconductor component, comprising:
    depositing a first layer comprising a salt of a central cation; and
    depositing a second layer comprising ligands onto the first layer, the first and second layers together forming an organic semiconductor layer with central cation/ligand complexes,
    within the complexes, each central cation is coordinated with at least one ligand.

2. The production method as claimed in claim 1, wherein the organic semiconductor layer comprises a plurality of first layers and a plurality of second layers, and
    the first and second layers are alternately deposited, each second layer being deposited onto a corresponding first layer.

3. The production method as claimed in claim 1, wherein an electrode is formed on a substrate, and
    the organic semiconductor layer is deposited onto the electrode.

4. The production method as claimed in claim 3, wherein each first layer has a maximum layer thickness of 2 nm, and each first layer modifies a surface potential of the electrode.

5. The production method as claimed in claim 1, wherein an electrode is formed on a substrate,
    a lower layer is formed on the electrode, the lower layer being formed from an organic semiconductor, and
    the organic semiconductor layer is deposited onto the lower layer.

6. The production method as claimed in claim 5, wherein each first layer has a maximum layer thickness of 2 nm, and each first layer modifies a surface potential of the lower layer.

7. The production method as claimed in claim 1, wherein each second layer has a maximum layer thickness of 100 nm.

8. The production method as claimed in claim 1, wherein each second layer has a maximum layer thickness of 20 nm.

9. The production method as claimed in claim 1, wherein the second layer is formed by depositing ligands together with organic semiconductor material.

10. An organic semiconductor component comprising:
    a first layer comprising a salt of a central cation; and
    a second layer comprising ligands, formed on the first layer, the first and second layers together forming an organic semiconductor layer having central cation/ligand complexes formed at a boundary between the first and second layers, wherein
    within the complexes, each central cation is coordinated with at least one ligand with a predetermined orientation of their dipoles.

11. The organic semiconductor component as claimed in claim 10, wherein the organic semiconductor layer comprises a plurality of first layers alternately arranged with a plurality of second layers with cation/ligand complexes formed at each first layer/second layer boundary.

12. The organic semiconductor component as claimed in claim 10, further comprising:
    a substrate;
    a first electrode formed on the substrate, the organic semiconductor layer being formed on the first electrode; and
    a second electrode formed on the organic semiconductor layer.

13. The organic semiconductor component as claimed in claim 10, wherein each first layer has a maximum layer thickness of 2 nm.

14. The organic semiconductor component as claimed in claim 10, wherein each second layer has a maximum layer thickness of 100 nm.

15. The organic semiconductor component as claimed in claim 10, wherein each second layer has a maximum layer thickness of 20 nm.

16. The organic semiconductor component as claimed in claim 10, wherein the ligands are selected from the group consisting of neutral small molecules.

17. The organic semiconductor component as claimed in claim 10, wherein the ligands are selected from the group consisting of emitters, hole transporters, electron transporters and matrix materials.

18. The organic semiconductor component as claimed in claim 10, further comprising:
    a substrate;
    a first electrode, the organic semiconductor layer being formed on the first electrode; and
    a second electrode formed on the organic semiconductor layer.

19. The organic semiconductor component as claimed in claim 18, wherein the organic semiconductor component is a light-emitting component.

20. The organic semiconductor component as claimed in claim 19, wherein the organic semiconductor component is an organic light-emitting diode (OLED) or an organic light-emitting electrochemical cell (OLEEC).

21. The organic semiconductor component as claimed in claim 10, wherein the central cations are selected from the group consisting of alkali metal cations, alkaline earth metal cations, and ammonium ions.

* * * * *